(12) United States Patent
Tamarkin et al.

(10) Patent No.: US 7,667,985 B1
(45) Date of Patent: Feb. 23, 2010

(54) COMPUTER NETWORK DEVICE AND METHOD OF ASSEMBLY

(75) Inventors: Vladimir Tamarkin, Huntingdon Valley, PA (US); Mark W. Wessel, Aston, PA (US)

(73) Assignee: QLogic, Corporation, Aliso Viejo, CA (US)

( * ) Notice: Subject to any disclaimer, the term of this patent is extended or adjusted under 35 U.S.C. 154(b) by 0 days.

(21) Appl. No.: 12/200,649

(22) Filed: Aug. 28, 2008

(51) Int. Cl.
*H05K 9/00* (2006.01)

(52) U.S. Cl. .................. 361/818; 361/800; 361/816; 361/753; 361/799; 361/758; 174/350; 174/377; 439/607.01; 439/607.07; 29/830

(58) Field of Classification Search .................. 361/742, 361/753, 758, 770, 799, 800, 816, 818; 174/350, 174/377, 358, 359; 439/607.01, 607.04, 439/607.07, 607.13, 607.14, 607.2, 607.35, 439/607.36; 29/830
See application file for complete search history.

(56) References Cited

U.S. PATENT DOCUMENTS

| | | | |
|---|---|---|---|
| 4,457,570 A | 7/1984 | Bogese, II | |
| 4,969,840 A | 11/1990 | Ii et al. | |
| 5,425,648 A | 6/1995 | Farham | |
| 5,554,042 A | 9/1996 | Denninger | |
| 5,836,786 A | 11/1998 | Pepe | |
| 5,919,050 A | 7/1999 | Kehley et al. | |
| 6,267,628 B1 | 7/2001 | Meckley et al. | |
| 6,319,047 B1 | 11/2001 | Kang | |
| 6,368,153 B1 | 4/2002 | Hwang | |
| 6,608,764 B2 | 8/2003 | Clark et al. | |
| 6,943,287 B2 * | 9/2005 | Lloyd et al. | 174/359 |
| 6,958,445 B1 * | 10/2005 | Boudreaux et al. | 174/359 |
| 6,964,581 B2 | 11/2005 | Chen et al. | |
| 7,014,484 B2 | 3/2006 | Hagiwara | |
| 7,067,734 B2 * | 6/2006 | Abe et al. | 174/359 |
| 7,288,001 B1 | 10/2007 | Aekins | |
| 2004/0246687 A1 * | 12/2004 | Abe et al. | 361/752 |
| 2004/0248436 A1 * | 12/2004 | Abe et al. | 439/76.1 |
| 2007/0015416 A1 | 1/2007 | Guiterrez et al. | |
| 2007/0202752 A1 | 8/2007 | Schumann et al. | |

* cited by examiner

*Primary Examiner*—Dameon E Levi
(74) *Attorney, Agent, or Firm*—Klein, O'Neill & Singh, LLP

(57) ABSTRACT

One embodiment of the present computer network device comprises a subassembly. The subassembly includes a support plate, a standoff extending from the support plate, a printed circuit board (PCB) secured to the standoff, an electromechanical connector secured to the PCB, an electromagnetic interference (EMI) cage secured to the PCB, and an EMI gasket engaging the EMI cage. The computer network device further comprises a guiding and retaining member that engages the support plate and assists in securing the subassembly within an enclosure. In a method of assembling the computer network device, the subassembly is first assembled before the subassembly is secured within an enclosure. Relative motion of the PCB and the standoffs is thus eliminated during the assembly process.

6 Claims, 3 Drawing Sheets

COMPUTER NETWORK DEVICE AND METHOD OF ASSEMBLY

BACKGROUND OF THE INVENTION

1. Field of the Invention

The present invention relates to computer network devices and methods of assembling computer network devices.

2. Description of Related Art

FIG. 1 schematically illustrates a typical computer network device 10. The device 10 may be for example, a switch, a host system, a server, a peripheral, an input/output subsystem, a bridge, a hub or a router. The device 10 includes at least one port 12 configured to receive a connector (not shown) for enabling the device 10 to communicate with other network devices.

The port 12 comprises an electromechanical connector 14 and an electromagnetic interference (EMI) cage 16. The connector 14 is secured to a printed circuit board (PCB) 18, which itself includes at least one electronic device 20, such as a processor or application-specific integrated circuit (ASIC). The PCB 18 is secured to standoffs 22 that extend from a floor 24 of an enclosure 26. The enclosure 26 surrounds and protects the components of the computer network device 10. A first end 27 of the EMI cage 16 extends through an opening 29 in a bezel 28 of the enclosure 26. An EMI gasket 30 engages the EMI cage 16 adjacent its first end 27. The EMI gasket 30 abuts an inside surface 32 of the bezel 28, and provides electrical grounding for the PCB 18 and related electronic components.

The computer network device 10 of FIG. 1 is assembled by first creating a subassembly consisting of the connector 14, the cage 16, the PCB 18, the electronic devices 20 and the EMI gasket 30. The subassembly is then positioned so that the EMI cage 16 is adjacent the opening 29. To effectively ground the PCB 18, the EMI gasket 30 must be urged against the bezel 28 so that it establishes firm electrical contact between the gasket 30 and the bezel 28. Thus, when the PCB 18 is in position a right-to-left directed force must be applied to the PCB 18 to force the gasket 30 against the bezel 28. During application of the force, fasteners such as screws 34 are driven through the PCB 18 and into the standoffs 23 to secure the PCB 18 in place.

The assembly process described above has disadvantages. First, when the PCB 18 moves right-to-left to establish firm electrical contact between the gasket 30 and the bezel 28, the PCB 18 may be damaged if the standoffs 22 scrape against the surface of the PCB 18 during this relative sliding motion. The PCB 18 includes sensitive electronic devices on its lower surface that can be damaged by scraping from the standoffs 22.

Second, the assembly process described above is performed by hand. Thus, the operator must apply the right-to-left force to the PCB 18 at the same time that he or she is trying to line up holes in the PCB 18 with the standoffs 22 and insert the screws 34. It is inconvenient for the operator to perform these two actions at the same time.

SUMMARY OF THE INVENTION

The preferred embodiments of the present computer network device and method of assembly have several features, no single one of which is solely responsible for their desirable attributes. Without limiting the scope of the present embodiments as expressed by the claims that follow, their more prominent features now will be discussed briefly. After considering this discussion, and particularly after reading the section entitled "Detailed Description of the Preferred Embodiments," one will understand how the features of the present embodiments provide advantages, which include the elimination of relative sliding motion between PCBs and the standoffs to which they are secured during assembly, which in turn reduces the rate at which PCBs get damaged during assembly.

One aspect of the present computer network device and method of assembly includes the realization that prior art methods of assembling computer network devices often cause damage to sensitive PCBs. Accordingly, an alternative method that eliminated relative motion between PCBs and the standoffs to which they are secured would reduce the cost of assembling computer network devices by reducing the rate at which the devices get damaged during assembly.

One embodiment of the present computer network device comprises a subassembly. The subassembly includes a support plate having a first edge, a standoff extending from a surface of the support plate, a printed circuit board (PCB) secured to the standoff and spaced from the support plate, an electromechanical connector secured to the PCB, an electromagnetic interference (EMI) cage secured to the PCB and surrounding the connector, and an EMI gasket engaging the EMI cage adjacent a first end thereof. The computer network device further comprises an enclosure including a bezel and an opening in the bezel. The enclosure contains the subassembly. The opening receives the first end of the EMI cage such that the EMI gasket abuts an inside surface of the bezel. A guiding and retaining member is secured to an inside surface of a first wall of the enclosure and is spaced from the bezel. A space between the bezel and the guiding and retaining member defines a subassembly receiving space. The guiding and retaining member includes a first surface that faces the bezel and a second surface including a slope. The slope is configured to engage and guide the support plate first edge as the subassembly is inserted into the subassembly receiving space. The first surface is configured to abut the support plate first edge to retain the subassembly within the subassembly receiving space.

One embodiment of the present method of assembling a computer network device comprises assembling a subassembly. Assembling the subassembly comprises securing a printed circuit board (PCB) to a support plate, the support plate including a first edge, securing an electromechanical connector to the PCB, securing an electromagnetic interference (EMI) cage to the PCB such that it surrounds the connector, and securing an EMI gasket to the EMI cage adjacent a first end thereof. The method further comprises securing a guiding and retaining member to an inside surface of a first wall of an enclosure. The enclosure includes a bezel and an opening in the bezel. The guiding and retaining member is spaced from the bezel. A space between the bezel and the guiding and retaining member defines a subassembly receiving space. The guiding and retaining member includes a first surface that faces the bezel and a second surface including a slope. The method further comprises positioning the subassembly partially within the subassembly receiving space such that the opening in the bezel receives the first end of the EMI cage and the first edge of the support plate rests on the slope of the guiding and retaining member second surface. The method further comprises applying a force to the subassembly to urge the subassembly into the subassembly receiving space such that the EMI gasket abuts an inside surface of the bezel and the first surface of the guiding and retaining member abuts the support plate first edge to retain the subassembly within the subassembly receiving space. The slope engages and guides the support plate first edge as the subassembly is inserted into the subassembly receiving space.

BRIEF DESCRIPTION OF THE DRAWINGS

The preferred embodiments of the present computer network device and method of assembly now will be discussed in detail with an emphasis on highlighting the advantageous features. These embodiments depict the novel and non-obvious computer network device and method of assembly shown in the accompanying drawings, which are for illustrative purposes only. These drawings include the following figures, in which like numerals indicate like parts.

DETAILED DESCRIPTION OF THE PREFERRED EMBODIMENTS

Figure 1:
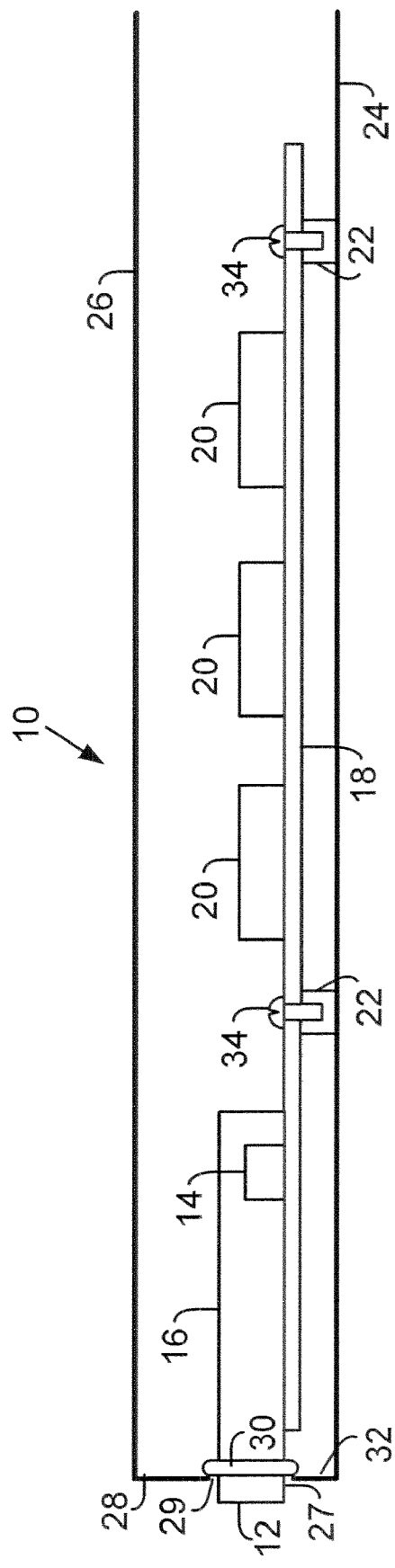
FIG. 1 is a schematic right-side elevation view of a prior art computer network device.

In the detailed description that follows, the present embodiments are described with reference to the drawings. In the drawings, elements of the present embodiments are labeled with reference numbers. These reference numbers are reproduced below in connection with the discussion of the corresponding drawing features.

Figure 2:
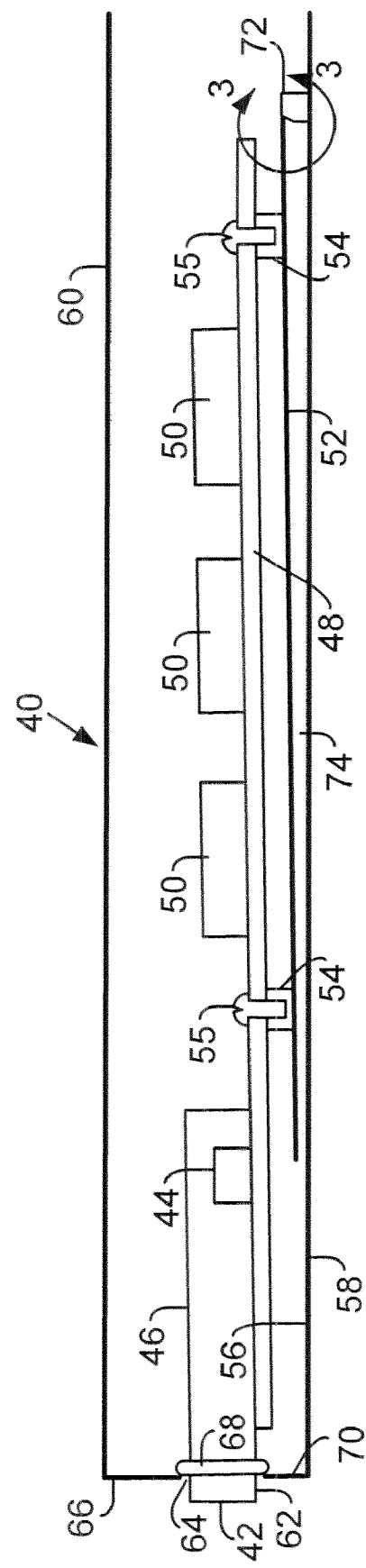
FIG. 2 is a schematic right-side elevation view of one embodiment of the present computer network device and method of assembly.
Figure 4:
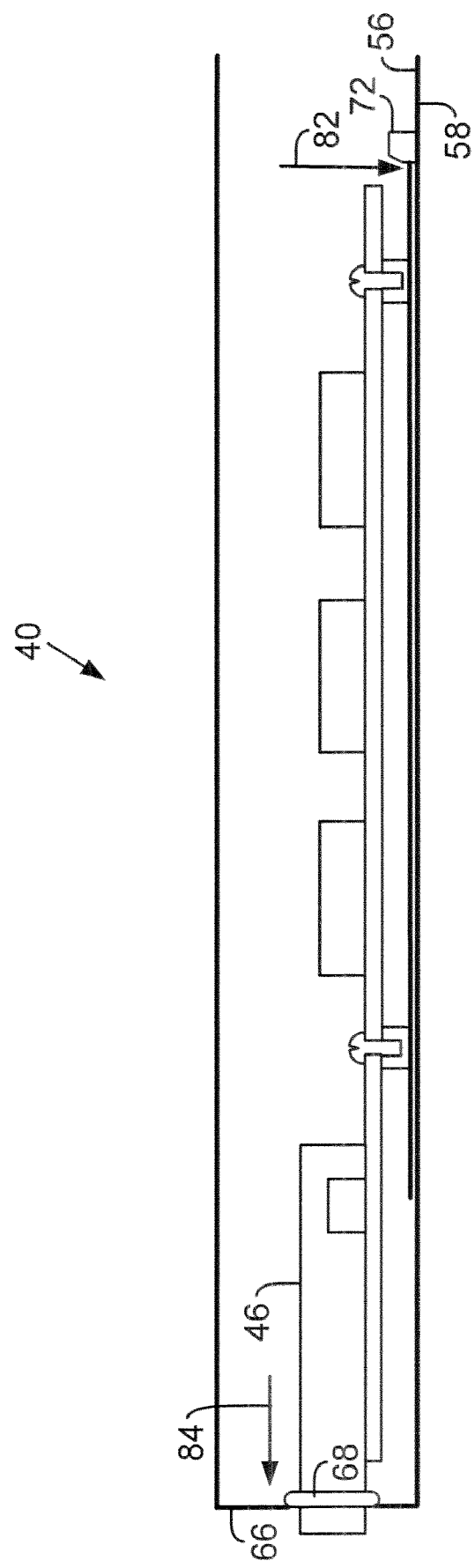
FIG. 4 is a schematic right-side elevation view of the computer network device of FIG. 2 and method of assembly.

FIGS. 2 and 4 schematically illustrate one embodiment of the present computer network device 40 and method of assembly. The device 40 may be, for example, a switch, a host system, a server, a peripheral, an input/output subsystem, a bridge, a hub or a router. The device 40 includes at least one port 42 configured to receive a connector 44 (not shown) for enabling the device 40 to communicate with other network devices.

The port 42 comprises an electromechanical connector 44 and an electromagnetic interference (EMI) cage 46. The cage 46 insulates the electronic components in the port 42 from EMI. The connector 44 is secured to a printed circuit board (PCB) 48, which itself includes at least one electronic device 50, such as a processor or application-specific integrated circuit (ASIC). A support plate 52 anchors the PCB 48, which is secured to at least one standoff 54 extending from the support plate 52. Fastening members, such as screws 55, secure the PCB 48 to the standoffs 54. The standoffs 54 create a space between the support plate 52 and the PCB 48. The standoffs 54 may be integral (formed as a single piece) with the support plate 52, or they may be separate pieces secured to the support plate 52.

The support plate 52 is secured to an inside surface 56 of a first wall 58 of an enclosure 60, which surrounds and protects the components of the computer network device 40. A first end 62 of the EMI cage 46 extends through an opening 64 in a bezel 66 of the enclosure 60. The standoffs 54 position the EMI cage 46 at the proper height to extend through the opening 64. An EMI gasket 68 engages the EMI cage 46 adjacent its first end 62. The EMI gasket 68 abuts an inside surface 70 of the bezel 66, and provides electrical grounding for the PCB 48 and related electronic components.

In contrast to the computer network device 10 of FIG. 1, the device 40 of FIGS. 2 and 4 includes a guiding and retaining member 72 extending from the inside surface 56 of the first wall 58 of the enclosure 60. The guiding and retaining member 72 is spaced from the bezel 66. A space between the bezel 66 and the guiding and retaining member 72 defines a subassembly receiving space 74, as described in further detail below. The guiding and retaining member 72 may be integral (formed as a single piece) with the enclosure 60, or it may be a separate piece secured to the first wall 58. Although not shown, the computer network device 40 may include more than one guiding and retaining member 72. For example, the device 40 may include one guiding and retaining member 72 for each PCB 48 in the device 40, and the guiding and retaining members 72 may extend across the device 40 from one side to another (into the plane of the paper in FIGS. 2 and 4).

Figure 3:
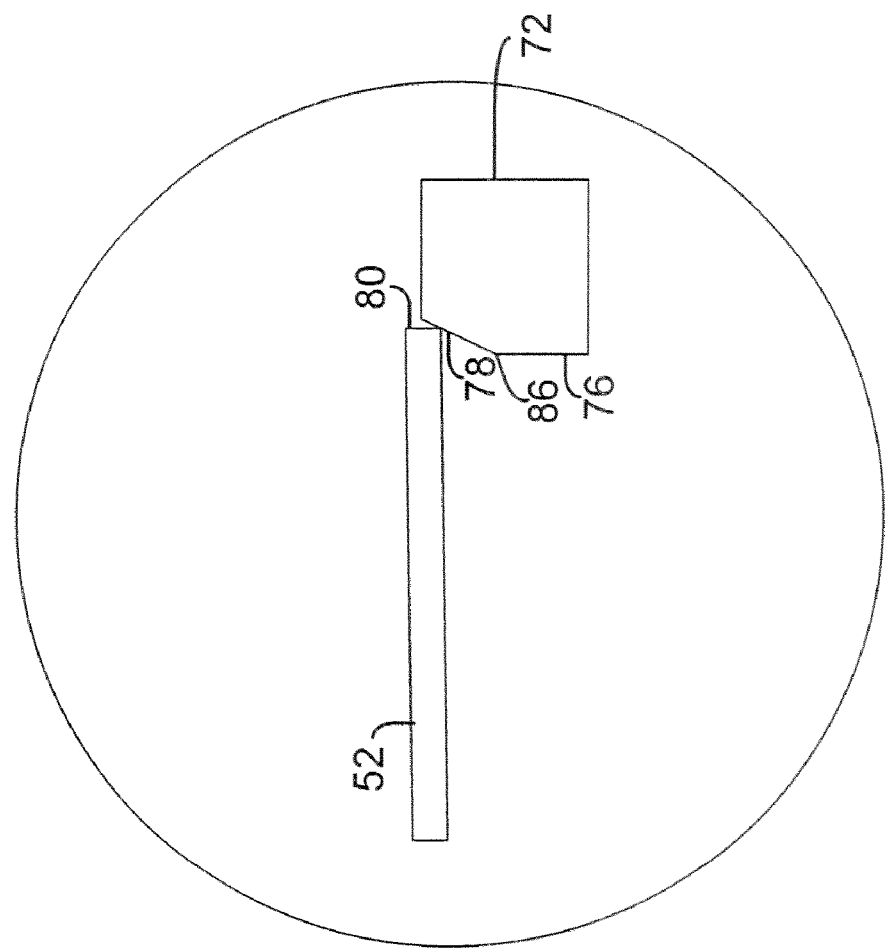
FIG. 3 is a detail view of the highlighted portion of FIG. 2, taken along the circle 3-3.

With reference to FIG. 3, the guiding and retaining member 72 includes a first surface 76 that faces the bezel 66. The guiding and retaining member 72 further includes a second surface 78 having a slope or ramp. The slope is configured to engage and guide a first edge 80 of the support plate 52 as the support plate 52 is inserted into the subassembly receiving space 74, as described in further detail below. The first surface 76 is configured to abut the first edge 80 of the support plate 52 to retain the support plate 52 within the subassembly receiving space 74, as also described in further detail below.

In one embodiment, the present method of assembling a computer network device 40 comprises assembling a subassembly. The subassembly includes the support plate 52 with standoffs 54, the PCB 48, the electromechanical connector 44, the EMI cage 46, and the EMI gasket 68. These components are assembled prior to securing any of the components within the enclosure 60. Advantageously, this method of assembly eliminates relative sliding motion between the PCB 48 and the standoffs 54. For example, the support plate 52 with standoffs 54 can be placed on a horizontal surface and the PCB 48 can be carefully lowered onto the standoffs 54 and secured with screws or another means of securement. There is less potential for damage to the PCB 48 when using this method, as it eliminates the simultaneous application of sideways force to compress the EMI gasket 68 against the bezel 66.

Figure 5:
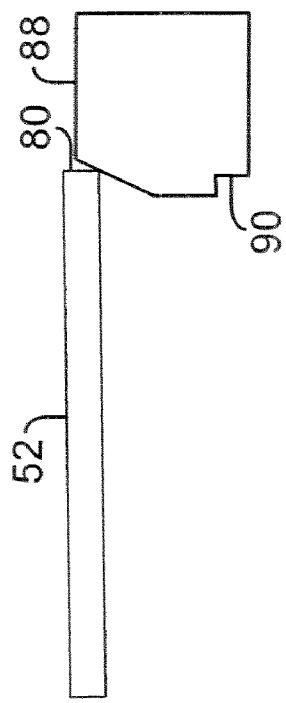
FIG. 5 is a detail view of a guiding and retaining member according to an alternative embodiment.

FIG. 2 illustrates the subassembly prior to securing the subassembly within the enclosure 60. The subassembly is positioned as shown with the EMI cage 46 extending through the opening 64 in the bezel 66 and the EMI gasket 68 adjacent the inside surface 70 of the bezel 66. The first edge 80 of the support plate 52 rests atop the slope of the second surface 78 (FIG. 3). To secure the subassembly within the subassembly receiving space 74, a force is applied to the subassembly to force the support plate 52 against the first wall 58 and the EMI gasket 68 against the bezel 66. For example, in one embodiment a force may be applied to the support plate 52 in the direction of the first arrow 82 in FIG. 4. When the subassembly is in the configuration of FIG. 2 and such a force is applied, the sloped second surface 78 of the guiding and retaining member 72 translates the applied force into a downward component and a right-to-left component, represented by the second arrow 84 in FIG. 4. When the first edge 80 of the support plate 52 reaches the border edge 86 (FIG. 3) between the first and second surfaces 78, 80 of the guiding and retaining member 72, the support plate 52 snaps into the subassembly receiving space 74 as shown in FIG. 4. The dimensions of the subassembly and the subassembly receiving space 74 are configured so that the guiding and retaining member 72 applies a net force on the subassembly, urging the EMI gasket 68 against the bezel 66 and maintaining electrical grounding for the EMI cage 46 (FIG. 4). With reference to FIG. 5, in an alternative embodiment the guiding and retaining member 88 may include an indentation 90 configured to receive the first edge 80 of the support plate 52. The indentation 90 may lock the first edge 80 down, preventing the subassembly from being removed from the subassembly receiving space 74.

In the method of assembling the computer network device 40 described above, relative sliding motion of the PCB 48 and the standoffs 54 is advantageously eliminated. Instead, the subassembly, comprising the support plate 52, standoffs 54, PCB 48, electromechanical connector 44, EMI cage 46, and EMI gasket 68, is assembled prior to securing any of the components within the enclosure 60. Once the subassembly is complete, it is positioned as shown in FIG. 2 and snapped into place with the aid of the guiding and retaining member 72. Since the PCB 48 is already secured to the standoffs 54 during the snapping in procedure, the standoffs 54 cannot damage the PCB 48. And, there is no need for the assembler to apply a sideways-directed force to the PCB 48 to compress the EMI gasket 68 while at the same time securing the PCB 48 to the standoffs 54. The PCB 48 is already secured to the standoffs 54 when the EMI gasket 68 is compressed. Further, the guiding and retaining member 72 advantageously provides a force urging the EMI gasket 68 against the bezel 66 and maintaining the grounded electrical contact between those two components.

The embodiments above have been described with reference to a small form-factor pluggable (SFP) style EMI cage. Those of ordinary skill in the art will appreciate, however, that the present embodiments are not limited to SFP style cages, where the cage and the connector are separate items. The present embodiments also encompass, for example, shielded connectors (connectors with an integrated EMI shield). In fact, the present embodiments encompass any connector that includes an EMI gasket compressed between a shield and a bezel.

SCOPE OF THE INVENTION

The above description presents the best mode contemplated for carrying out the present computer network device and method of assembly, and of the manner and process of making and using it, in such full, clear, concise, and exact terms as to enable any person skilled in the art to which it pertains to make and use this computer network device and method of assembly. This computer network device and method of assembly is, however, susceptible to modifications and alternate constructions from that discussed above that are fully equivalent. Consequently, this computer network device and method of assembly is not limited to the particular embodiments disclosed. On the contrary, this computer network device and method of assembly covers all modifications and alternate constructions coming within the spirit and scope of the computer network device and method of assembly as generally expressed by the following claims, which particularly point out and distinctly claim the subject matter of the computer network device and method of assembly.

What is claimed is:

1. A computer network device, comprising:
   a subassembly including
      a support plate having a first edge;
      a standoff extending from a surface of the support plate;
      a printed circuit board (PCB) secured to the standoff and spaced from the support plate;
      an electromechanical connector secured to the PCB;
      an electromagnetic interference (EMI) cage secured to the PCB and surrounding the connector; and
      an EMI gasket engaging the EMI cage adjacent a first end thereof;
   an enclosure including a bezel and an opening in the bezel, the enclosure containing the subassembly, the opening receiving the first end of the EMI cage such that the EMI gasket abuts an inside surface of the bezel; and
   a guiding and retaining member secured to an inside surface of a first wall of the enclosure and spaced from the bezel, a space between the bezel and the guiding and retaining member defining a subassembly receiving space;
   wherein the guiding and retaining member includes a first surface that faces the bezel and a second surface including a slope, and the slope is configured to engage and guide the support plate first edge as the subassembly is inserted into the subassembly receiving space, and the first surface is configured to abut the support plate first edge to retain the subassembly within the subassembly receiving space.

2. The computer network device of claim 1, wherein the device is a switch, a host system, a server, a peripheral, an input/output subsystem, a bridge, a hub or a router.

3. The computer network device of claim 1, wherein the first surface of the guiding and retaining member includes an indentation configured to receive the support plate first edge.

4. A method of assembling a computer network device, the method comprising:
   assembling a subassembly by
      securing a printed circuit board (PCB) to a support plate, the support plate including a first edge;
      securing an electromechanical connector the PCB;
      securing an electromagnetic interference (EMI) cage to the PCB such that it surrounds the connector; and
      securing an EMI gasket to the EMI cage adjacent a first end thereof;
   securing a guiding and retaining member to an inside surface of a first wall of an enclosure, the enclosure including a bezel and an opening in the bezel, the guiding and retaining member being spaced from the bezel, a space between the bezel and the guiding and retaining member defining a subassembly receiving space, the guiding and retaining member including a first surface that faces the bezel and a second surface including a slope;
   positioning the subassembly partially within the subassembly receiving space such that the opening in the bezel receives the first end of the EMI cage and the first edge of the support plate rests on the slope of the guiding and retaining member second surface; and
   applying a force to the subassembly to urge the subassembly into the subassembly receiving space such that the EMI gasket abuts an inside surface of the bezel and the first surface of the guiding and retaining member abuts the support plate first edge to retain the subassembly within the subassembly receiving space;
   wherein the slope engages and guides the support plate first edge as the subassembly is inserted into the subassembly receiving space.

5. The method of claim 4, wherein the device is a switch, a host system, a server, a peripheral, an input/output subsystem, a bridge, a hub or a router.

6. The method of claim 4, wherein securing the PCB to the support plate comprises securing the PCB to a standoff extending from a surface of a support plate such that the PCB is spaced from the support plate.

* * * * *

UNITED STATES PATENT AND TRADEMARK OFFICE
CERTIFICATE OF CORRECTION

PATENT NO. : 7,667,985 B1  Page 1 of 1
APPLICATION NO. : 12/200649
DATED : February 23, 2010
INVENTOR(S) : Tamarkin et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 63 days.

Signed and Sealed this

Seventh Day of December, 2010

David J. Kappos
*Director of the United States Patent and Trademark Office*